(12) United States Patent
Zhang et al.

(10) Patent No.: US 8,356,976 B2
(45) Date of Patent: Jan. 22, 2013

(54) MOUNTING APPARATUS FOR FAN

(75) Inventors: Guang-Yi Zhang, Shenzhen (CN); Zhe Zhang, Shenzhen (CN); Jian Fu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 906 days.

(21) Appl. No.: 12/475,583

(22) Filed: May 31, 2009

(65) Prior Publication Data

US 2010/0272578 A1  Oct. 28, 2010

(30) Foreign Application Priority Data

Apr. 23, 2009 (CN) .......................... 2009 1 0301783

(51) Int. Cl.
*F04D 29/64* (2006.01)
(52) U.S. Cl. .................. 415/213.1; 415/214.1; 454/184; 361/679.48; 361/679.49; 361/695

(58) Field of Classification Search ............... 415/213.1, 415/214.1, 220, 222–223; 454/184; 361/679.48, 361/679.49, 679.5, 679.51, 679.47, 695–697
See application file for complete search history.

(56) References Cited

U.S. PATENT DOCUMENTS 5,788,566 A * 8/1998 McAnally et al. ............ 454/184
6,826,048 B1 * 11/2004 Dean et al. .................... 361/695

* cited by examiner

*Primary Examiner* — Christopher Verdier
(74) *Attorney, Agent, or Firm* — Altis Law Group, Inc.

(57) ABSTRACT

A mounting apparatus for a fan includes a plate and a frame. The plate includes a venting portion. A number of locking holes and an engaging hole are defined in the plate, surrounding the venting portion. The frame includes a main body and a resilient portion extending from a side of the main body. An airflow opening is defined in the main body aligned with the venting portion of the plate. A number of hooks extend from the main body, around the airflow opening, to be engaged in the corresponding locking holes of the plate. A bulge protrudes out from the resilient portion to be engaged in the engaging hole.

11 Claims, 5 Drawing Sheets

MOUNTING APPARATUS FOR FAN

BACKGROUND

1. Technical Field

The present disclosure relates to mounting apparatuses and, more particularly, to a mounting apparatus for securing a fan in a computer system.

2. Description of Related Art

In an ordinary computer system, a plurality of fans are secured by screws or the like to a plate of the computer system, for producing a flow of cooling air over certain electrical components within the computer system, thereby dissipating heat generated by the electrical components to assure the components operate within a desired temperature range. When the plurality of fans are to be installed to or removed from the plate, a cover of the plate should be removed to expose the plurality of fans to gain access with proper tools. The installation or removal of the screws is time consuming and troublesome.

DETAILED DESCRIPTION

Figure 1:
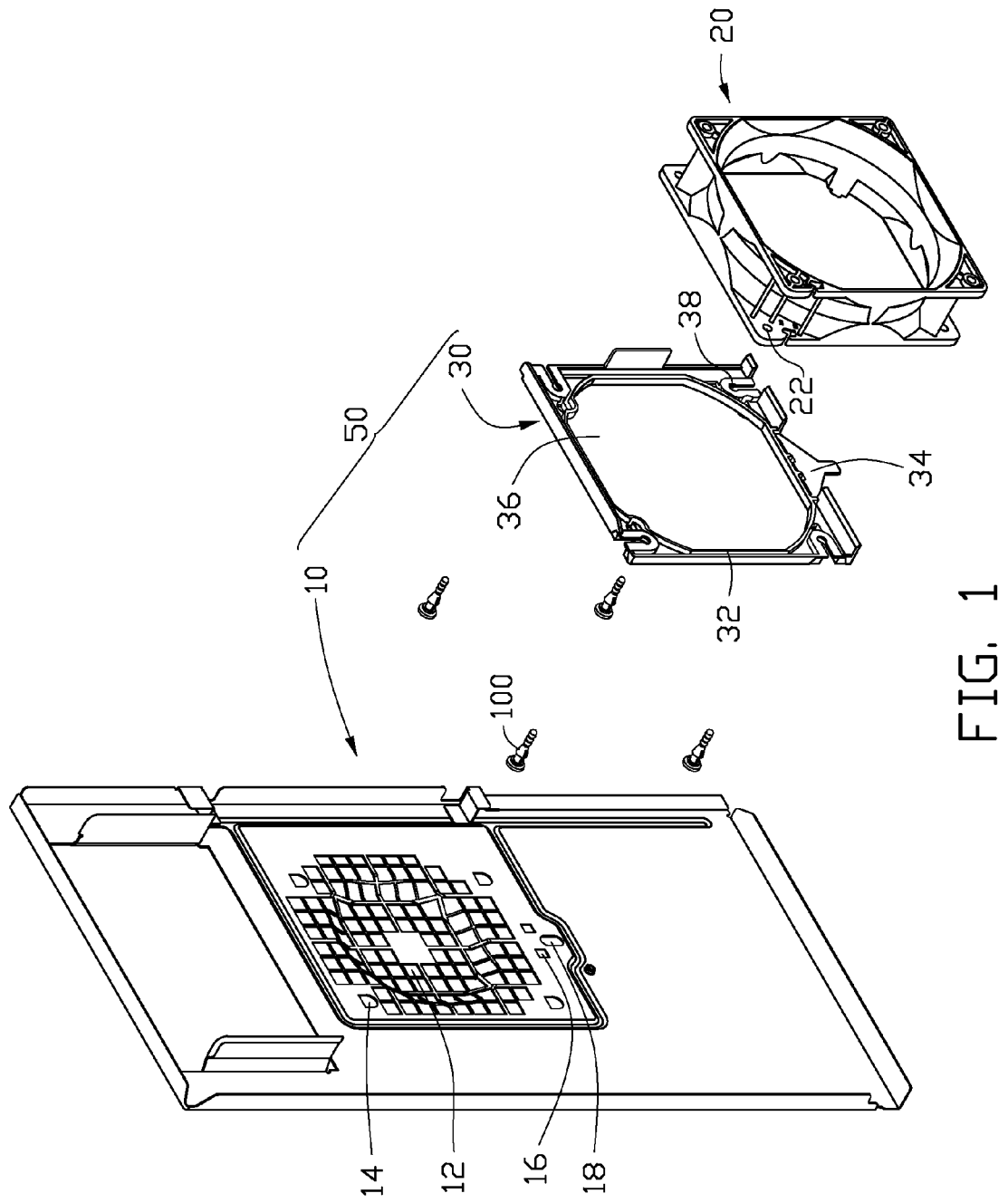
FIG. 1 is an exploded, isometric view of an exemplary embodiment of a mounting apparatus with a fan, the mounting apparatus including a frame.

Referring to FIG. 1, an exemplary embodiment of a mounting apparatus 50 is provided for mounting a fan 20 to a computer system. The mounting apparatus includes a plate 10 and a frame 30. A plurality of fixing holes 22 is defined in a lateral surface of the fan 20. In this embodiment, the plurality of fixing holes 22 includes four fixing holes.

The plate 10 defines a venting portion 12 for exhausting hot air from the computer system. A plurality of locking holes 14 is defined in the plate 10 surrounding the venting portion 12. At least one engaging hole 16 is defined in the plate 10 below the venting portion 12. An elongated sliding slot 18 is defined in the plate 10 between and below the two engaging holes 16. In this embodiment, there are four locking holes 14 and two engaging holes 16 defined in the plate 10.

Figure 2:
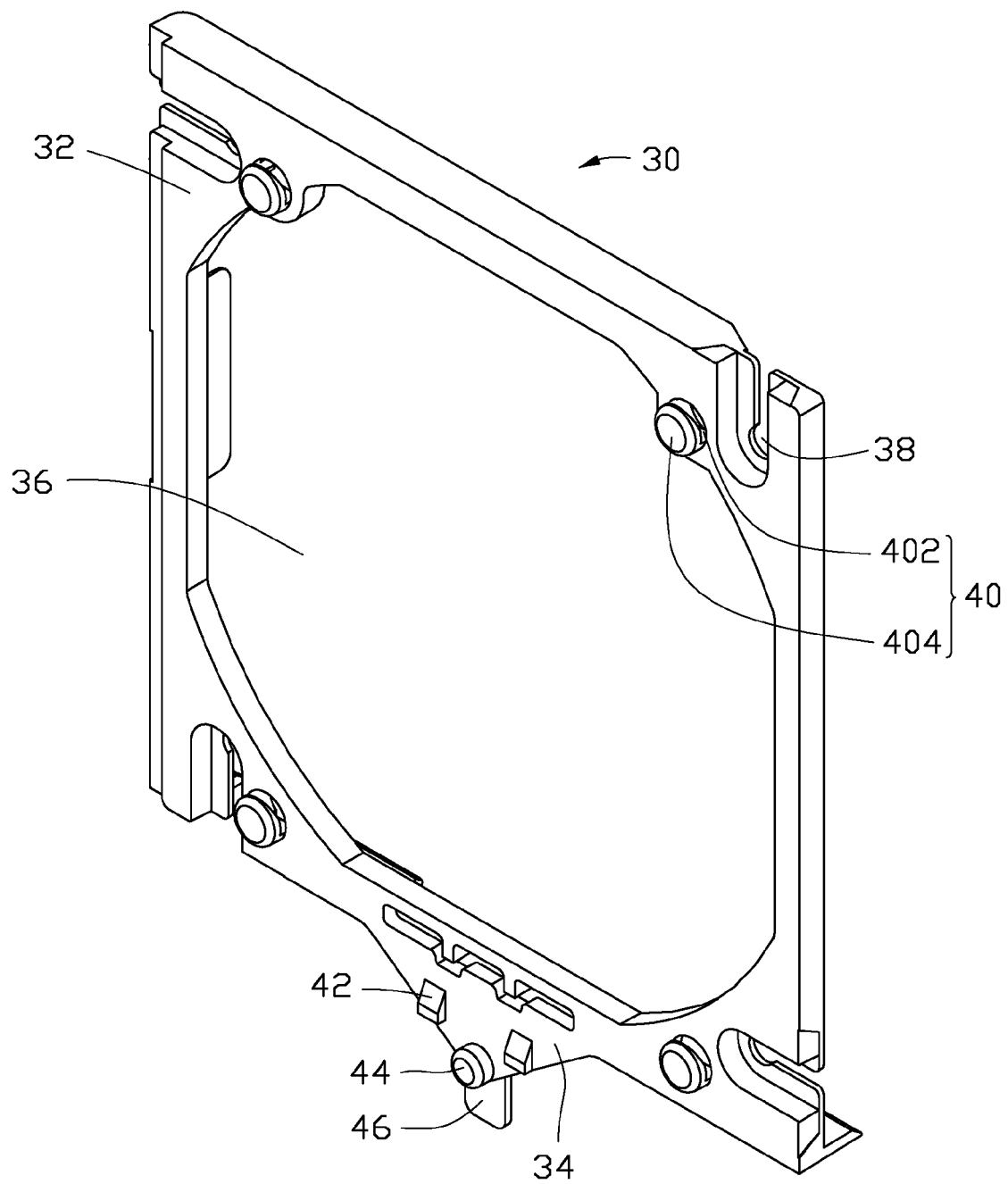
FIG. 2 is an enlarged, isometric view of the frame of FIG. 1, but viewed from another perspective.

Referring to FIG. 2, the frame 30 includes a square-shaped main body 32 and a resilient portion 34 extending from a bottom side of the main body 32. An airflow opening 36 is defined in a center of the main body 32, to allow air to flow therethrough. Four notches 38 are respectively defined in four corners of the main body 32 surrounding the airflow opening 36. Each notch has a generally stepped cross-section with a wider recess and a narrower through slot defined therein so that a head of a fastener can be retained in the recessed part while the body of the fastener can pass through the slot. Four hooks 40 extend from the main body 32 around the airflow opening 36, corresponding to the four locking holes 14 of the plate 10, each hook 40 adjacent to a corresponding notch 38. Each hook 40 includes a connecting arm 402 perpendicularly extending from the main body 32 and a clasp 404 perpendicularly extending up from a distal end of the connecting arm 402. At least one wedge-shaped bulge 42 protrudes from the resilient portion 34, corresponding to the at least one engaging hole 16 of the plate 10. A post 44 protrudes from the resilient portion 34 corresponding to the sliding slot 18 of the plate 10. A shielding piece 46 extends from a bottom of the resilient portion 34, away from the main body 32. In this embodiment, there are two bulges 42 protruding from the resilient portion 34.

Figure 3:
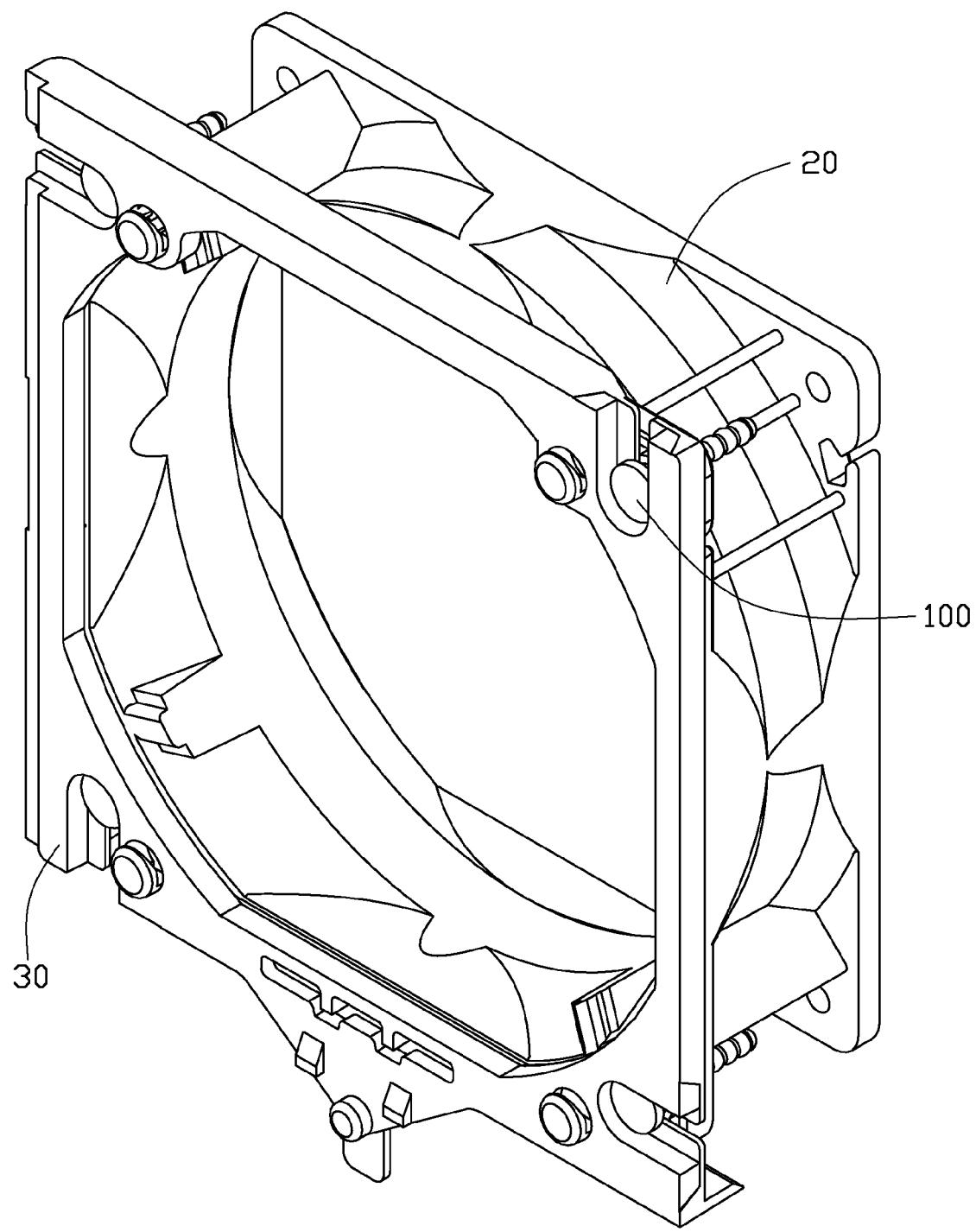
FIG. 3 is an isometric, assembled view of the frame and the fan of FIG. 1.
Figure 4:
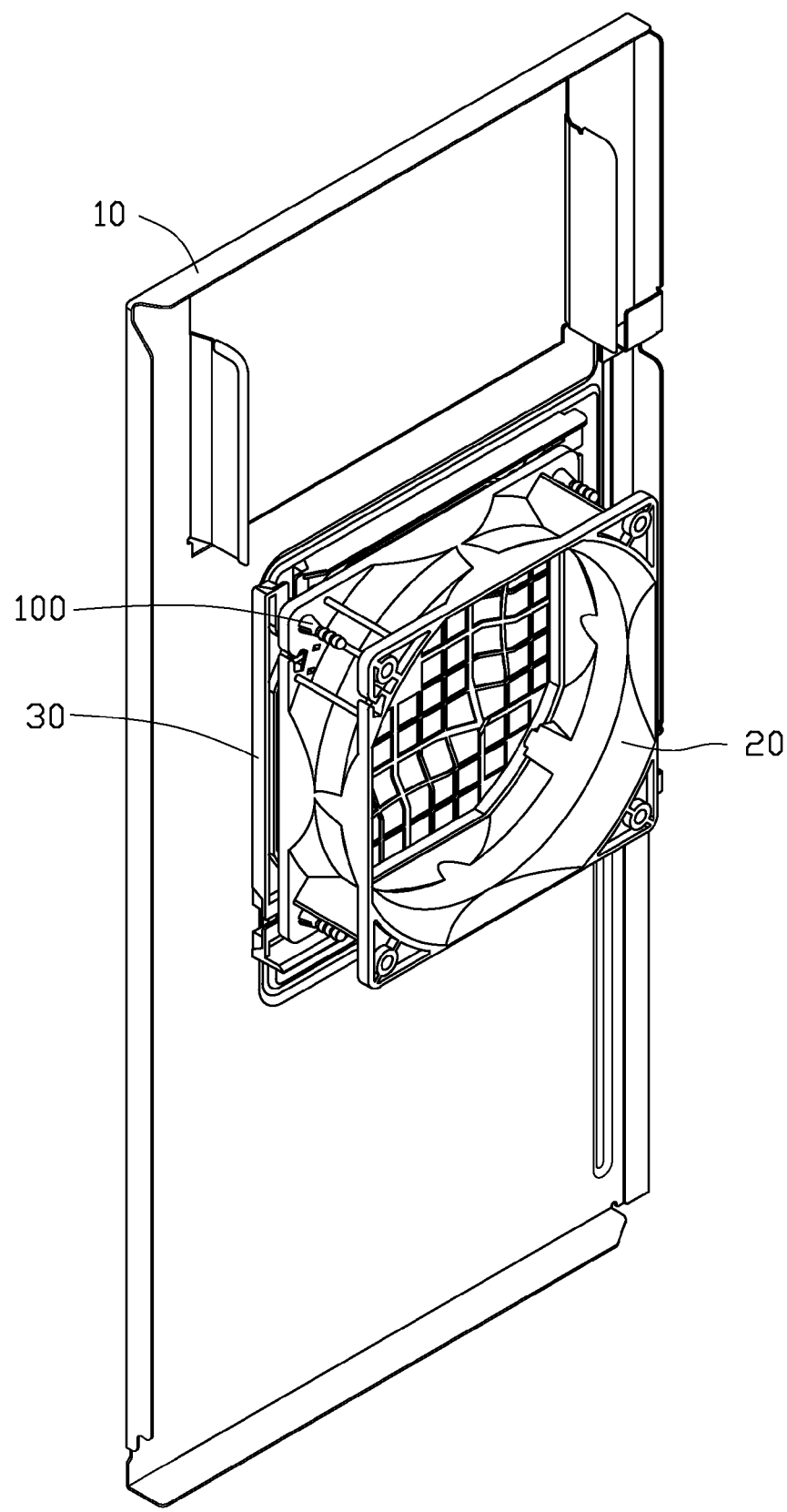
FIG. 4 is an assembled, isometric view of the mounting apparatus and the fan of FIG. 1.
Figure 5:
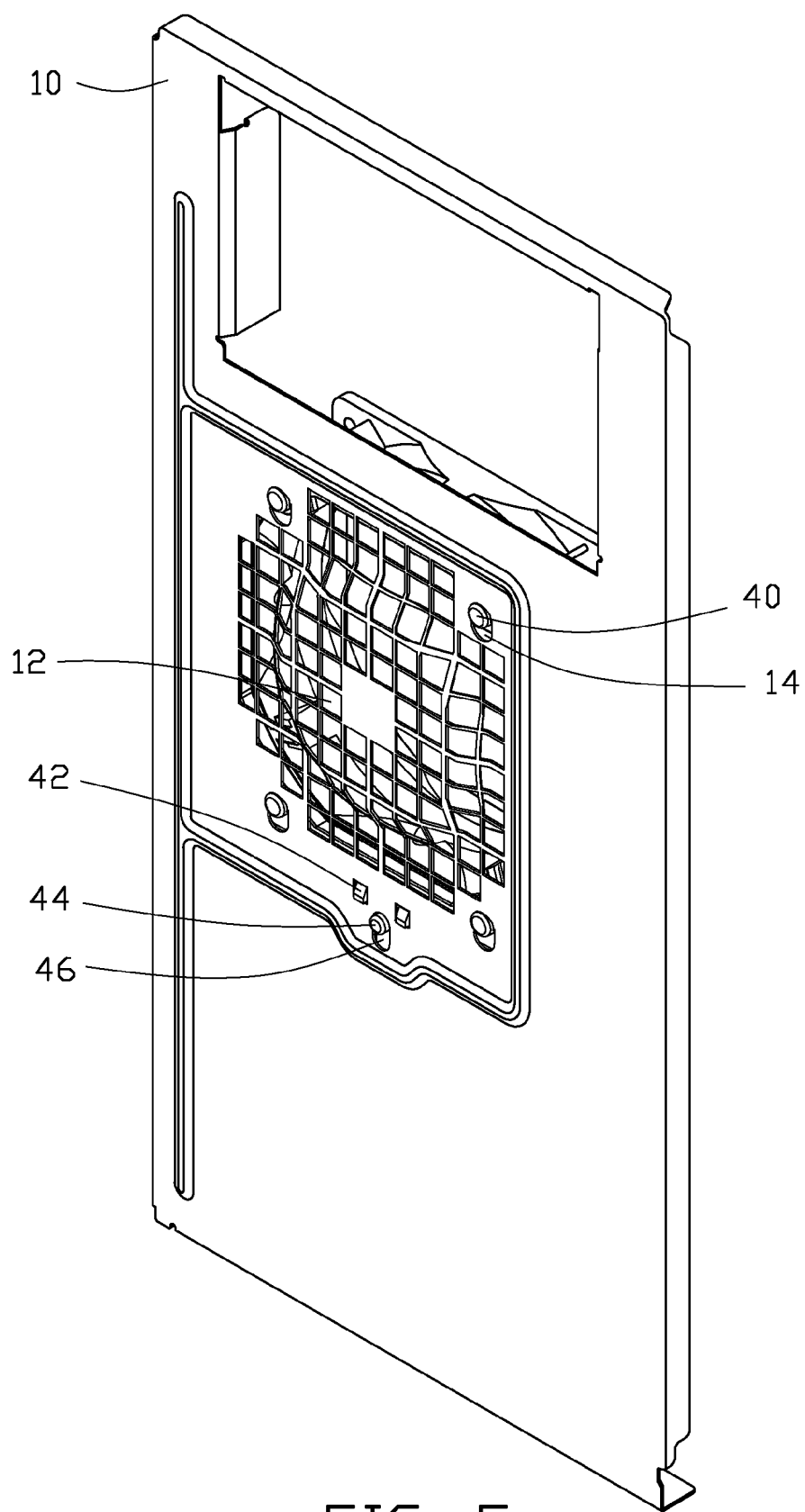
FIG. 5 is similar to FIG. 4, but viewed from another perspective.

Referring to FIGS. 3-5, in assembly, fasteners 100 are respectively passed through the corresponding notches 38 of the main body 32 of the frame 30, to be respectively locked in the corresponding fixing holes 22 of the fan 20. Therefore, the fan 20 is fixed to the frame 30.

The combined assembly of the frame 30 and the fan 20 are attached to the plate 10. The hooks 40 of the frame 30 are respectively inserted into the corresponding locking holes 14 of the plate 10. The bulges 42 of the resilient portion 34 resist against the plate 10 below the corresponding engaging holes 16, to deform the resilient portion 34. The post 44 aligns with a lower part of the sliding slot 18 of the plate 10. The frame 30 is moved up, the connecting arm 402 of each hook 40 slides up in a corresponding locking hole 14, the bulges 42 slide up on the plate 10 towards the corresponding engaging holes 16, until the bulges 42 align with the corresponding engaging holes 16. The resilient portion 34 is restored, causing the bulges 42 to engage in the corresponding engaging holes 16, and causing the post 44 to be inserted into an upper part of the sliding slot 18. Each clasp 404 and the main body 32 sandwich a part above a corresponding locking hole 14 of the plate 10 therebetween. The shielding piece 46 shields the sliding slot 18. Therefore, the frame 30 can be fixed to the plate 10 conveniently.

In disassembling the fan 20 from the plate 10, the resilient portion 34 is deformed away from the plate 10, to disengage the post 44 from the sliding slot 18, and to disengage the bulges 42 from the corresponding engaging holes 16. The frame 30 is moved down, to disengage the hooks 40 from the corresponding locking holes 14. Therefore, the combined assembly of the frame 30 and the fan 20 can be conveniently removed from the plate 10.

It is understandable that in another embodiment, one locking hole 14 and two engaging holes 16 surrounding the venting portion 12 are enough. Correspondingly, one hook 40 engages in the locking hole 14 and two bulges 42 engage in the engaging holes 16 for fixing the frame 30 to the plate 10.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternately embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A mounting apparatus for a fan, the mounting apparatus comprising:

a plate defining a venting portion for venting air, wherein a plurality of locking holes and at least one engaging hole are defined in the plate surrounding the venting portion; and a frame for mounting the fan to the plate, comprising:
- a main body defining an airflow opening aligning with the venting portion of the plate, to allow air to flow between the plate and the fan;
- a resilient portion extending from a side of the main body;
- a plurality of hooks extending from the main body around the airflow opening, to be engaged in the corresponding locking holes of the plate; and
- at least one bulge protruding out from the resilient portion, wherein the at least one bulge is operable to be engaged in the at least one engaging hole correspondingly,
- wherein the plate further defines a slot, and the frame further comprises a post protruding out from the resilient portion to be engaged in the slot.

2. The mounting apparatus of claim 1, wherein the slot of the plate is elongated, a shielding piece extends from a bottom of the resilient portion, away from the main body to shield the slot.

3. The mounting apparatus of claim 1, wherein each hook comprises a connecting arm perpendicularly extending from the main body, and a clasp perpendicularly extends up from a distal end of the connecting arm to engage with the corresponding locking hole.

4. The mounting apparatus of claim 1, wherein a plurality of notches are respectively defined in four corners of the main body surrounding the airflow opening, to fix the fan to the frame via a plurality of fasteners.

5. A fan assembly comprising:
a fan;
a plate defining a venting portion for venting air, wherein at least one locking hole and two engaging holes are defined in the plate, surrounding the venting portion; and a frame for mounting the fan, comprising:
- a main body defining an airflow opening aligning with the venting portion of the plate, to allow air to flow between the plate and the fan;
- a resilient portion extending from a side of the main body;
- at least one hook extending from the main body around the airflow opening, to be engaged in the at least one locking hole of the plate; and
- two bulges protruding out from the resilient portion, wherein the bulges are operable to be engaged in the corresponding engaging holes of the plate.

6. The assembly of claim 5, wherein the plate further defines a sliding slot, and the frame further comprises a post protruding out from the resilient portion to engage in the sliding slot.

7. The assembly of claim 6, wherein the sliding slot of the plate is elongated, a shielding piece extends from a bottom of the resilient portion, away from the main body, to shield the sliding slot in response to the bulges being engaged in the corresponding engaging holes.

8. The assembly of claim 5, wherein each hook comprises a connecting arm perpendicularly extending from the main body, and a clasp perpendicularly extends up from a distal end of the connecting arm to engage with the corresponding locking hole.

9. The assembly of claim 8, wherein the at least one hook comprises four hooks, and the at least one locking hole comprises four locking holes.

10. The assembly of claim 5, wherein a plurality of fixing holes are defined in a lateral surface of the fan, and a plurality of notches are respectively defined in four corners of the main body, a plurality of fasteners pass through the corresponding notches of main body to be engaged in the corresponding fixing holes of the fan, to fix the fan to the frame.

11. The assembly of claim 10, wherein the plurality of notches comprise four notches, and the plurality of fixing holes comprise four fixing holes.

* * * * *